(12) United States Patent
Liu et al.

(10) Patent No.: US 6,544,882 B1
(45) Date of Patent: Apr. 8, 2003

(54) METHOD TO IMPROVE RELIABILITY OF MULTILAYER STRUCTURES OF FSG (F-DOPED $SiO_2$) DIELECTRIC LAYERS AND ALUMINUM-COPPER-TIN LAYERS IN INTEGRATED CIRCUITS

(75) Inventors: Chung-Shi Liu, Hsin-Chu (TW); Shau-Lin Shue, Hsinchu (TW); Chen-Hua Yu, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/482,049

(22) Filed: Jan. 13, 2000

(51) Int. Cl.[7] ............................................. H01L 21/302
(52) U.S. Cl. ...................... 438/622; 438/652; 438/688; 438/783; 438/952
(58) Field of Search ................................. 438/622, 652, 438/688, 783, 952

(56) References Cited

U.S. PATENT DOCUMENTS

| | | | |
|---|---|---|---|
| 5,567,483 A | * 10/1996 | Foster et al. ................. | 427/535 |
| 5,652,464 A | 7/1997 | Liao et al. ................... | 257/751 |
| 5,688,717 A | 11/1997 | Shen et al. .................. | 438/190 |
| 5,700,737 A | 12/1997 | Yu et al. ...................... | 438/636 |
| 5,759,916 A | 6/1998 | Hsu et al. .................... | 438/636 |
| 5,874,355 A | 2/1999 | Huang et al. ................ | 438/627 |
| 5,895,266 A | 4/1999 | Fu et al. ...................... | 438/648 |
| 5,994,217 A | * 11/1999 | Ng ............................... | 438/636 |
| 6,114,766 A | * 9/2000 | Shields ........................ | 257/758 |
| 6,159,851 A | * 12/2000 | Chen et al. .................. | 438/669 |
| 6,242,338 B1 | * 6/2001 | Liu et al. ..................... | 438/622 |

* cited by examiner

Primary Examiner—George Goudreau
(74) Attorney, Agent, or Firm—George O. Saile; Stephen B. Ackerman

(57) ABSTRACT

In the fabrication of integrated circuits containing multilevel structures of FSG (F-doped $SiO_2$) dielectric layers and aluminum-copper-TiN layers, superior adhesion between the FSG and aluminum-copper-TiN is achieved by subjecting the aluminum-copper-TiN layer to a plasma containing $N_2$ and $H_2$ or $N_2$ and $NH_3$ prior to deposition of the FSG layer. It is believed that the plasma treatment converts unreacted Ti within the TiN layer to TiN and, also, stuffs grain boundaries within the TiN layer with $N_2$. The result is a void-free TiN layer which is impervious to F atoms residing in the FSG layer.

2 Claims, 4 Drawing Sheets

METHOD TO IMPROVE RELIABILITY OF MULTILAYER STRUCTURES OF FSG (F-DOPED SIO₂) DIELECTRIC LAYERS AND ALUMINUM-COPPER-TIN LAYERS IN INTEGRATED CIRCUITS

BACKGROUND OF THE INVENTION (1) Field of the Invention

This invention relates to semiconductor integrated circuits and more specifically to a method of fabrication used for semiconductor integrated circuit devices, whereby the reliability and interlevel adhesion of multilayer structures of FSG (F-doped $SiO_2$) dielectric layers and aluminum-copper-TiN conducting layers are improved.

(2) Description of Related Art

In the fabrication of semiconductor integrated circuits multilayer structures of dielectric layers and patterned conducting layers are used to form the interconnections between discrete devices formed in/on a semiconductor substrate. Depending upon the levels of integration required, one or more conducting layers with the appropriate interconnection patterns are formed alternately with interlevel dielectric layers and connections between the metal layers are provided through "via plugs" or "via studs". Typically in highly dense, sub micron-size integrated circuit devices, where small features are desired, three, four or more levels of interconnection metallization may be required.

Therefore, it is imperative that the multiple layers of dielectric materials and conducting materials be compatible in terms of mutual adhesion and chemical stability. Also, manufacturing processes for the individual layers, such as deposition and pattern formation processes, must be compatible with both previously deposited layers and with subsequently deposited layers and the steps of forming thereof.

One problem encountered when using FSG (F-doped $SiO_2$) dielectric layers in multilevel integrated circuit structures is that F atoms incorporated in the FSG layers have high mobility and affinity to moisture. During integrated circuit processing the mobility of the F atoms and the affinity of F atoms to moisture cause the formation of HF at interfaces between FSG and deposited conducting layers such as aluminum-copper or aluminum and aluminum-copper or aluminum having a surface layer of TiN, used as an ARC (Anti Reflection Coating) layer. The formation of HF at the interfaces allows reaction of the HF with the metal layers. The reaction of HF with the metal layers causes corrosion of the aluminum-copper or aluminum conducting layers and attack of unreacted Ti within the TiN ARC layer. Both the corrosion of the aluminum-copper or aluminum conducting layers and the attack of unreacted Ti within the TiN ARC layer cause reduced adhesion of FSG to the metal layer and delamination of the FSG layer from the metal layer. This delamination usually appears during subsequent thermal cycling processing steps and manifests itself in the form of bubbles or micro areas of delamination between the FSG layer and metal layer. Such loss of adhesion and delamination are unacceptable and result in low manufacturing process yield. Furthermore, interfaces which are susceptible to reaction between HF and metal layers are sources of reliability degradation and can thus cause premature failure of the integrated circuit devices.

It is, therefore, desirable to have a manufacturing process for formation of a FSG (F-doped $SiO_2$) dielectric layer over a patterned aluminum-copper-TiN interconnection layer that produces good adhesion between the FSG layer and aluminum-copper and/or TiN layers and is free of delamination between the FSG layer and the aluminum-copper-TiN layer. The integrity of the interfaces between the FSG layers and aluminum-copper-TiN layers must be maintained throughout the manufacturing processes for multilevel integrated circuits, such manufacturing processes requiring multiple thermal cycles for the formation of multilevel patterns of aluminum-copper-TiN embedded in FSG dielectric layers.

Numerous patents teach methods of treating TiN layers to result in improved TiN properties, as recited in the following referenced patents. U.S. Pat. No. 5,874,355 entitled "Method To Prevent Volcano Effect In Tungsten Plug Deposition" granted Feb. 23, 1999 to Ji-Chung Huang et al. teaches a $N_2$ plasma treatment of a TiN/Ti bilayer to stuff the grain boundaries of the TiN layer with $N_2$.

U.S. Pat. No. 5,759,916 entitled "Method For Forming A Void-Free Titanium Nitride Anti-Reflective Coating (ARC) Layer Upon An Aluminum Containing Conductor Layer" granted Jun. 2, 1998 to Te-Ming Hsu et al. describes a method of forming a void-free titanium nitride layer upon an aluminum conductor layer. The titanium nitride layer comprises a first layer of titanium rich titanium nitride and a second layer of stoichiometric titanium nitride. Together, the titanium rich titanium nitride layer and the stoichiometric titanium nitride layer form the void-free titanium nitride.

U.S. Pat. No. 5,688,717 entitled "Construction That Prevents The Undercut Of Interconnect Lines In Plasma Metal Etch Systems" granted Nov. 18, 1997 to Lewis Shen et al. shows a $Ti_xN_y$ layer, not necessarily stoichiometric, in combination with a TiN layer interposed between oxide and aluminum layers to improve the adhesion of the aluminum layer to the oxide layer.

U.S. Pat. No. 5,652,464 entitled "Integrated Circuit With A Titanium Nitride Contact Barrier Having Oxygen Stuffed Grain Boundaries" granted Jul. 29, 1997 to De-Dui Liao et al. shows a barrier layer overlying a silicide film, where the barrier layer includes titanium oxynitride and titanium nitride.

U.S. Pat. No. 5,895,266 entitled "Titanium Nitride Barrier Layers" granted Apr. 20, 1999 to Jianming Fu et al. describes a composite barrier layer formed by sequentially sputter depositing a first titanium layer, oxidizing this titanium layer, sputter depositing a titanium nitride layer, oxidizing the titanium nitride layer, and optionally depositing an overlying titanium wetting layer.

U.S. Pat. No. 5,700,737 entitled "PECVD Silicon Nitride For Etch Stop Mask And Ozone TEOS Pattern Sensitivity Elimination" granted Dec. 23, 1997 to Chen-Hun Yu et al. shows a TiN ARC (Anti Reflection Coating) layer over aluminum.

The present invention is directed to a novel method of forming a FSG (F-doped $SiO_2$) dielectric layer over a patterned aluminum-copper-TiN interconnection layer that produces good adhesion between the FSG layer and aluminum-copper and/or TiN layers and is free of delamination between the FSG layer and the aluminum-copper-TiN layer.

SUMMARY OF THE INVENTION

It is a general object of the present invention to provide an improved method of forming an integrated circuit having FSG (F-doped $SiO_2$) as the dielectric layer in multilevel interconnection structures in combination with patterned aluminum-copper-TiN conductors, in which the adhesion between the FSG (F-doped $SiO_2$) dielectric layer and the aluminum-copper-TiN pattern is improved.

A more specific object of the present invention is to provide an improved method of forming an integrated circuit having FSG (F-doped $SiO_2$) as the dielectric layer in multilevel interconnection structures in combination with patterned aluminum-copper-TiN conductors, in which F atoms residing in the FSG dielectric layer are prevented from reacting with the patterned aluminum-copper-TiN conductor and causing delamination between the FSG layer and the patterned aluminun-copper-TiN layer.

Another object of the present invention is to provide an improved method of forming an integrated circuit having FSG (F-doped $SiO_2$) as the dielectric layer in multilevel interconnection structures in combination with patterned aluminum-copper-TiN conductors, whereby the TiN overlying the aluminum-copper is rendered impervious to F atoms residing in the FSG layer.

In accordance with the present invention, the above and other objectives are realized by using a method of fabricating a void-free titanium nitride protective layer on the surface of an aluminum-copper layer, comprising the steps of: providing a semiconductor substrate having a layer of aluminum-copper deposited thereon and having a TiN ARC (Anti-Reflection Coating) layer deposited onto the layer of aluminum-copper; and exposing the TiN ARC (Anti-Reflection Coating) layer to a plasma containing $N_2$ and $H_2$ or $N_2$ and $NH_3$.

In a second embodiment of the present invention, the above and other objectives are realized by using a method of forming a FSG (F-doped $SiO_2$) dielectric layer over a conducting patterned layer formed in aluminum-copper and capped with a TiN ARC (Anti-Reflection Coating) layer comprising the steps of: providing a semiconductor substrate having the conducting patterned layer formed in aluminum-copper and capped with a TiN ARC (Anti-Reflection Coating) layer; exposing the TiN ARC (Anti-Reflection Coating) layer to a plasma containing $N_2$ and $H_2$ or $N_2$ and $NH_3$; and then depositing the FSG (F-doped $SiO_2$) dielectric layer.

And in a third embodiment of the present invention, the above and other objectives are realized by using a method of forming a FSG (F-doped $SiO_2$) dielectric layer over a conducting patterned layer formed in aluminum-copper and capped with a TiN ARC (Anti-Reflection Coating) layer comprising the steps of: providing a semiconductor substrate having the aluminum-copper layer blanket deposited thereon and having the aluminum-copper layer capped with a TiN ARC (Anti-Reflection Coating) layer; exposing the TiN ARC (Anti-Reflection Coating) layer to a plasma containing $N_2$ and $H_2$ or $N_2$ and $NH_3$; after exposure of the TiN ARC (Anti-Reflection Coating) layer to the plasma containing $N_2$ and $H_2$ or $N_2$ and $NH_3$, forming by etching a pattern in the aluminum-copper and the TiN ARC (Anti-Reflection Coating) layer; and then depositing the FSG (F-doped $SiO_2$) dielectric layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of forming an integrated circuit having FSG (F-doped $SiO_2$) as the dielectric layer in multilevel interconnection structures in combination with patterned aluminum-copper-TiN conductors, in which the adhesion between the FSG (F-doped $SiO_2$) dielectric layer and the aluminum-copper-TiN pattern is improved will now be described in detail.

Figure 1A:
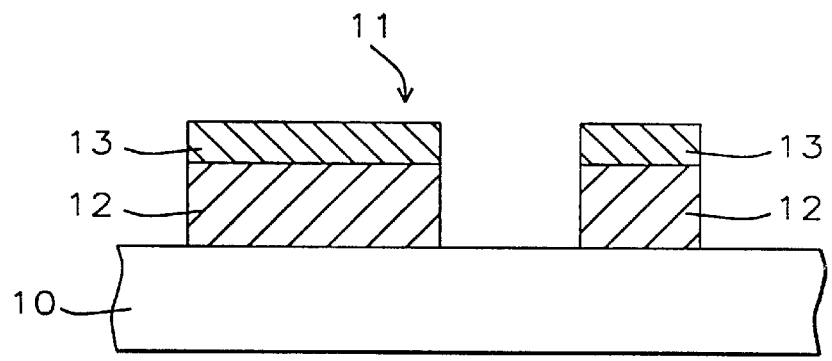
FIGS. 1A–1C, which in cross-sectional representation illustrate the method of one embodiment of the present invention.

Referring to FIG. 1A, a semiconductor substrate 10 is provided having a patterned structure 11 thereon. The patterned structure 11 comprises an aluminum-copper layer 12 and a TiN ARC (Anti-Reflection Coating) layer 13. Typically the aluminum-copper layer 12 has a thickness between about 3000 and 10,000 Angstroms and the TiN ARC (Anti-Reflection Coating) layer 13 has a thickness between about 200 and 1000 Angstroms. The TiN ARC (Anti-Reflection Coating) layer 13 is deposited by PVD (Physical Vapor Deposition) sputtering of a Ti target in an ambient gas comprising nitrogen and argon.

Figure 1B:
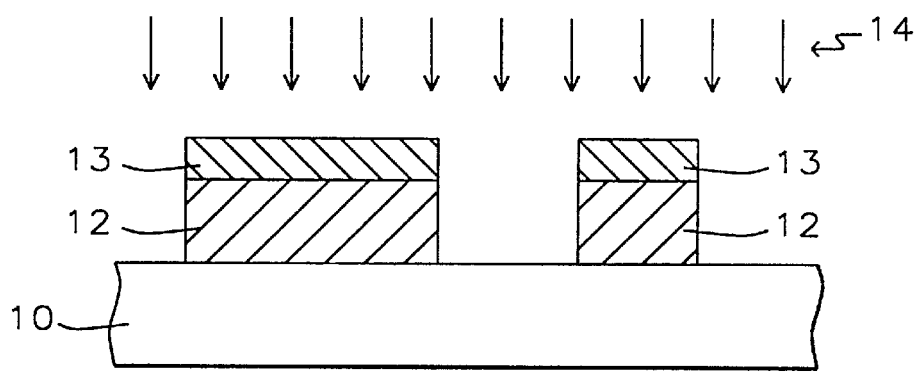
Figure 1C:
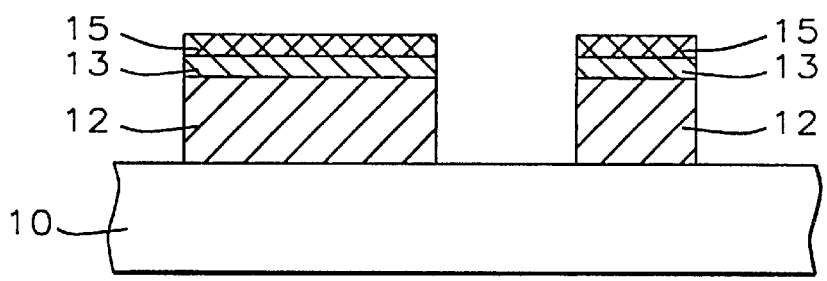

Now referring to FIG. 1B, the patterned structure 11 is exposed to a plasma containing $N_2$ and $H_2$ or $N_2$ and $NH_3$, as schematically indicated by arrows 14. The plasma containing $N_2$ and $H_2$ has a pressure of between about 1 mTorr and 10 Torr, a flow rate of $N_2$ between about 100 and 3000 sccm, a flow rate of $H_2$ between about 50 and 500 sccm and applied rf power between about 100 and 500 Watts. Alternately, a plasma containing $N_2$ and $NH_3$ may be used and have a pressure of between about 1 mTorr and 10 Torr, a flow rate of $N_2$ between about 100 and 3000 sccm, a flow rate of $NH_3$ between about 100 and 1000 sccm and applied rf power between about 100 and 500 Watts. The time of exposure of patterned structure 11 to the plasma containing $N_2$ and $H_2$ or $N_2$ and $NH_3$ is between about 10 and 120 sec. Exposure of patterned structure 11 to the plasma containing $N_2$ and $H_2$ or $N_2$ and $NH_3$ causes formation of a protective layer 15 on the TiN ARC (Anti-Reflection Coating) layer 13, as shown in FIG. 1C. The protective layer 15 may form on the top surface of the TiN ARC (Anti-Reflection Coating) layer 13 or may form throughout the entire thickness of layer 13 rendering the entire layer 13 protective. In either case, the plasma treated TiN layer has superior protective properties against attack by HF or other corrosive materials.

Figure 2A:
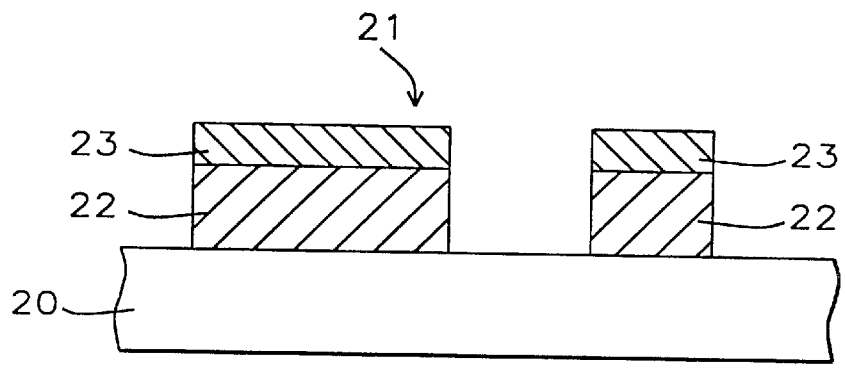
FIGS. 2A–2D, which in cross-sectional representation illustrate the method of a second embodiment of the present invention.

An improved manufacturing process for forming a FSG (F-doped $SiO_2$) dielectric layer over a conducting patterned layer formed in aluminum-copper and capped with a TiN ARC (Anti-Reflection Coating) is schematically illustrated in FIGS. 2A–2D. Referring to FIG. 2A, a semiconductor substrate 20 is provided having a patterned structure 21 thereon. The patterned structure 21 comprises an aluminum-copper layer 22 and a TiN ARC (Anti-Reflection Coating) layer 23. Typically the aluminum-copper layer 22 has a thickness between about 3000 and 10,000 Angstroms and the TiN ARC (Anti-Reflection Coating) layer 23 has a thickness between about 200 and 1000 Angstroms. The TiN ARC (Anti-Reflection Coating) layer 23 is deposited by PVD (Physical Vapor Deposition) sputtering of a Ti target in an ambient gas comprising nitrogen and argon.

Figure 2B:
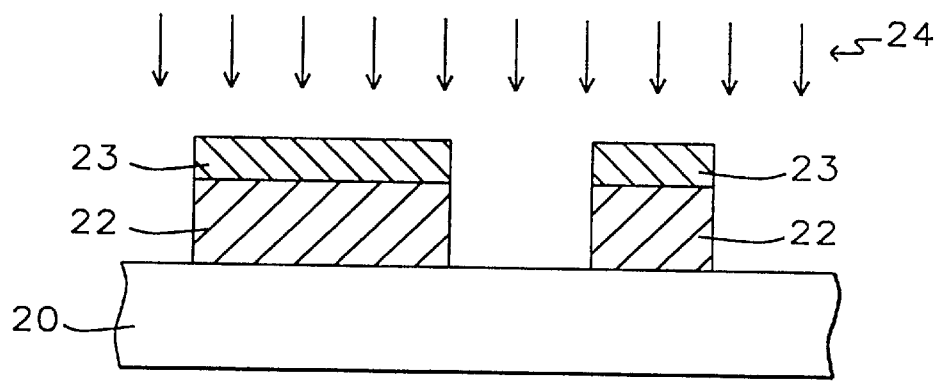
Figure 2C:
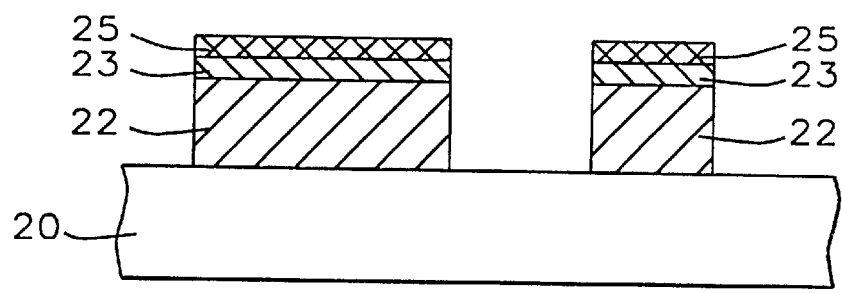
Figure 2D:
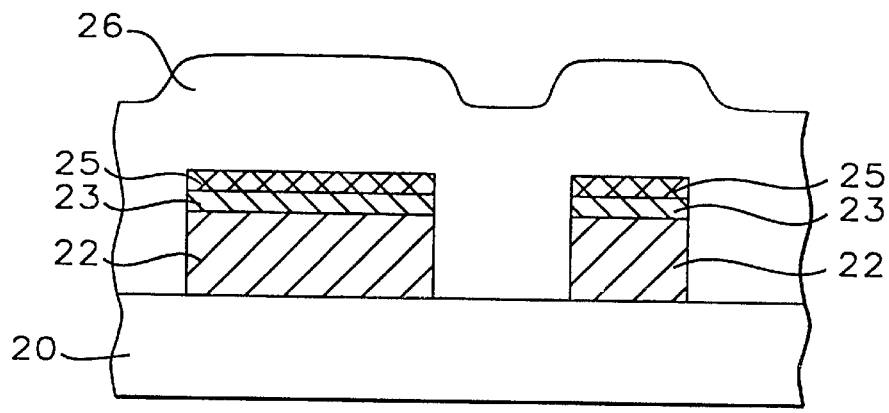

Now referring to FIG. 2B, the patterned structure 21 is exposed to a plasma containing $N_2$ and $H_2$ or $N_2$ and $NH_3$, as schematically indicated by arrows 24. The plasma containing $N_2$ and $H_2$ has a pressure of between about 1 mTorr and 10 Torr, a flow rate of $N_2$ between about 100 and 3000 sccm, a flow rate of $H_2$ between about 50 and 500 sccm and applied rf power between about 100 and 500 Watts. Alternately, a plasma containing $N_2$ and $NH_3$ may be used and have a pressure of between about 1 mTorr and 10 Torr, a flow rate of $N_2$ between about 100 and 3000 sccm, a flow rate of $NH_3$ between about 100 and 1000 sccm and applied rf power between about 100 and 500 Watts. The time of exposure of patterned structure 21 to the plasma containing $N_2$ and $H_2$ or $N_2$ and $NH_3$ is between about 10 and 120 sec. Exposure of patterned structure 21 to the plasma containing $N_2$ and $H_2$ or $N_2$ and $NH_3$ causes formation of a protective layer 25 on the TiN ARC (Anti-Reflection Coating) layer 23, as shown in FIG. 2C. The protective layer 25 may form on the top surface of the TiN ARC (Anti-Reflection Coating) layer 23 or may form throughout the entire thickness of layer 23 rendering the entire layer 23 protective. In either case, the plasma treated TiN layer has superior protective properties against attack by HF or other corrosive materials. Next, as illustrated in FIG. 2D, a FSG (F-doped $SiO_2$) dielectric layer 26 is deposited over the plasma treated patterned structure 21. The FSG (F-doped $SiO_2$) dielectric layer is deposited by PECVD (Plasma Enhanced Chemical Vapor Deposition) from a mixture of $SiF_4$, $SiH_4$, $O_2$ and argon at about 400° C.

Figure 3A:
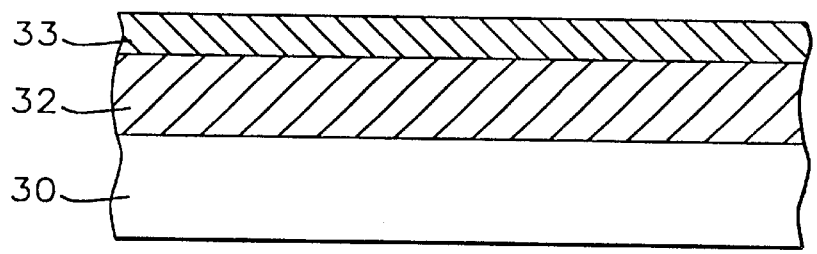
FIGS. 3A–3E, which in cross-sectional representation illustrate the method of a third embodiment of the present invention.
Figure 3B:
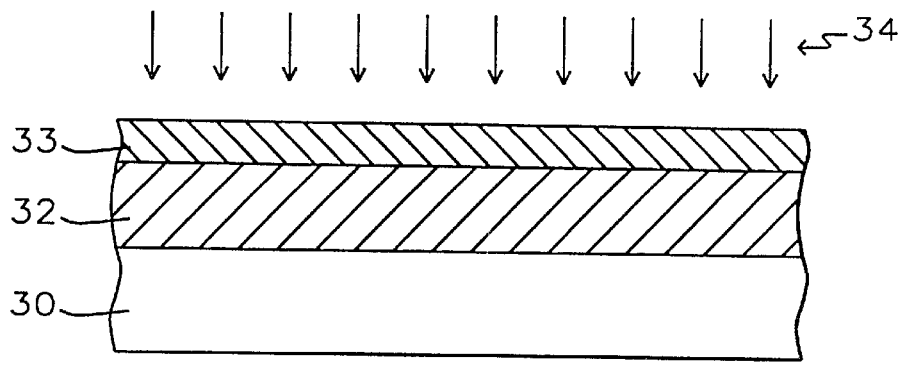
Figure 3C:
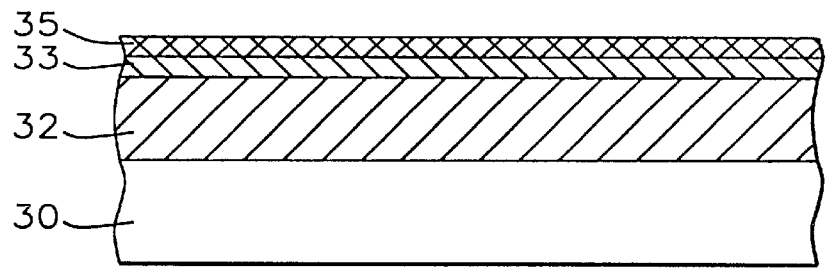
Figure 3D:
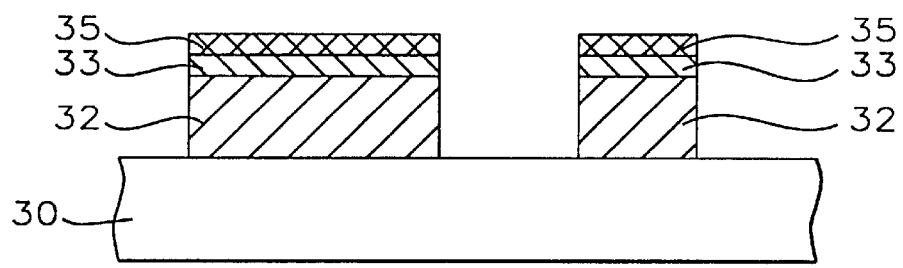
Figure 3E:
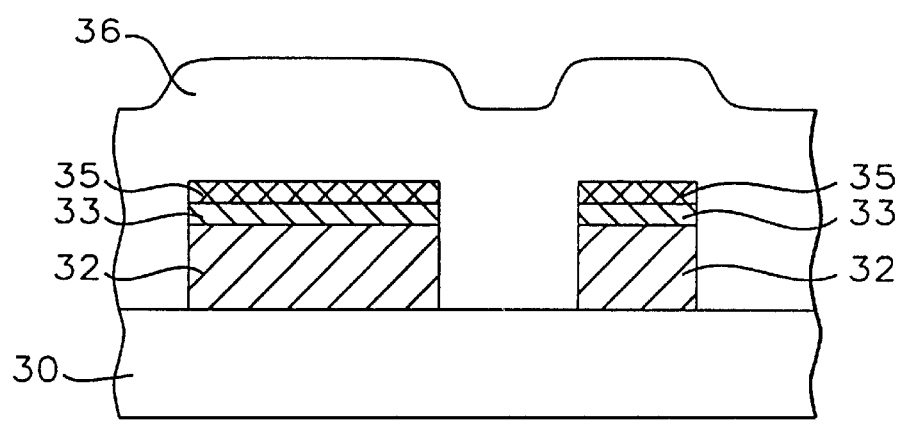

FIGS. 3A–3E schematically illustrate a third embodiment of the present invention. Referring to FIG. 3A, a semiconductor substrate 30 is provided having deposited thereon blanket layers of aluminum-copper 32 and TiN ARC (Anti-Reflection Coating) 33 overlying the alumnium-copper. Typically the aluminum-copper layer 32 has a thickness between about 3000 and 10,000 Angstroms and the TiN ARC (Anti-Reflection Coating) layer 33 has a thickness between about 200 and 1000 Angstroms. The TiN ARC (Anti-Reflection Coating) layer 33 is deposited by PVD (Physical Vapor Deposition) sputtering of a Ti target in an ambient gas comprising nitrogen and argon. As illustrated in FIG. 3B, the TiN ARC (Anti-Reflection Coating) layer 33 is exposed to a plasma containing $N_2$ and $H_2$ or $N_2$ and $NH_3$, as schematically indicated by arrows 34. The plasma containing $N_2$ and $H_2$ has a pressure of between about 1 mTorr and 10 Torr, a flow rate of $N_2$ between about 1000 and 3000 sccm, a flow rate of $H_2$ between about 50 and 500 sccm and applied rf power between about 100 and 500 Watts. Alternately, a plasma containing $N_2$ and $NH_3$ may be used and have a pressure of between about 1 mTorr and 10 Torr, a flow rate of $N_2$ between about 100 and 3000 sccm, a flow rate of $NH_3$ between about 100 and 1000 sccm and applied rf power between about 100 and 500 Watts. The time of exposure of the TiN ARC (Anti-Reflection Coating) layer 33 to the plasma containing $N_2$ and $H_2$ or $N_2$ and $NH_3$ is between about 10 and 120 sec. Exposure of the TiN ARC (Anti-Reflection Coating) layer 33 to the plasma containing $N_2$ and $H_2$ or $N_2$ and $NH_3$ causes formation of a protective layer 35 on the TiN ARC (Anti-Reflection Coating) layer 33, as shown in FIG. 3C. The protective layer 35 may form on the top surface of the TiN ARC (Anti-Reflection Coating) layer 33 or may form throughout the entire thickness of layer 33 rendering the entire layer 33 protective. In either case, the plasma treated TiN layer has superior protective properties against attack by HF or other corrosive materials. Next, as schematically illustrated in FIG. 3D, conventional patterning and etching processes are used to form a pattern 31 in the aluminum-copper and plasma treated TiN layers. A FSG (F-doped $SiO_2$) dielectric layer 36 is then deposited over the plasma treated patterned structure 31, as schematically illustrated in FIG. 3E. The FSG (F-doped $SiO_2$) dielectric layer is deposited by PECVD (Plasma Enhanced Chemical Vapor Deposition) from a mixture of $SiF_4$, $SiH_4$, $O_2$ and argon at about 400° C.

While the invention has been particularly shown and described with reference to the preferred embodiments thereof, it will be understood by those skilled in the art that various changes in form and details may be made without departing from the spirit and scope of the invention.

What is claimed is:

1. A method of forming a FSG dielectric layer over a conducting patterned layer formed in aluminum-copper and capped with a TiN ARC layer comprising the steps of:

providing a semiconductor substrate having said aluminum-copper layer blanket deposited thereon and said aluminum-copper layer capped with a TiN ARC layer;

exposing said TiN ARC layer to a plasma containing $N_2$ and $H_2$ at a pressure of between about 1 mTorr and 10 Torr, a flow rate of $N_2$ between about 100 and 3000 sccm, a flow rate of $H_2$ between about 50 and 500 sccm and applied rf power between about 100 and 500 Watts;

after exposure of said TiN ARC layer to said plasma containing $N_2$ and $H_2$, forming by etching a pattern in said aluminum-copper and said TiN ARC layer; and depositing said FSG dielectric layer.

2. A method of forming a FSG dielectric layer over a conducting patterned layer formed in aluminum-copper and capped with a TiN ARC layer comprising the steps of:

providing a semiconductor substrate having said aluminum-copper layer blanket deposited thereon and said aluminum-copper layer capped with a TiN ARC layer;

exposing said TiN ARC layer to a plasma containing $N_2$ and $NH_3$ at a pressure of between about 1 mTorr and 10 Torr, a flow rate of $N_2$ between about 100 and 3000 sccm, a flow rate of $NH_3$ between about 100 and 1000 sccm and applied rf power between about 100 and 500 Watts;

after exposure of said TiN ARC layer to said plasma containing $N_2$ and $NH_3$, forming by etching a pattern in said aluminum-copper and said TiN ARC layer; and depositing said FSG dielectric layer.

* * * * *